US007663853B2

United States Patent
Ker et al.

(10) Patent No.: US 7,663,853 B2
(45) Date of Patent: *Feb. 16, 2010

(54) ON-CHIP LATCH-UP PROTECTION CIRCUIT

(76) Inventors: Ming-Dou Ker, 4F-3, No. 3, Lane 200, Pao-Shan Rd., Lin 8, Kao-Feng Li, E. District, Hsinchu (TW); Jang-Jie Peng, No. 27, Lin 4 Datan Tsuen, Guanyin Shiang, Taoyuan (TW) 328; Hsin-Chin Jiang, 6Fl., No. 10, Shinan St., Shinyi Chiu, Taipei (TW) 110

(*) Notice: Subject to any disclaimer, the term of this patent is extended or adjusted under 35 U.S.C. 154(b) by 0 days.

This patent is subject to a terminal disclaimer.

(21) Appl. No.: 11/618,674

(22) Filed: Dec. 29, 2006

(65) Prior Publication Data
US 2007/0188952 A1 Aug. 16, 2007

Related U.S. Application Data

(63) Continuation of application No. 10/446,049, filed on May 28, 2003, now Pat. No. 7,253,999.

(30) Foreign Application Priority Data
May 29, 2002 (TW) .............................. 91111475 A

(51) Int. Cl.
*H02H 7/00* (2006.01)
(52) U.S. Cl. .................................................. 361/93.1
(58) Field of Classification Search ................. 361/93.1
See application file for complete search history.

(56) References Cited

U.S. PATENT DOCUMENTS

| 5,212,616 | A  | * | 5/1993 | Dhong et al. | ............... | 361/18 |
| 6,188,237 | B1 | * | 2/2001 | Suzuki et al. | ............... | 326/30 |
| 6,735,755 | B2 |   | 5/2004 | Shau | ............... | 716/16 |
| 6,765,771 | B2 |   | 7/2004 | Ker et al. | ............... | 361/56 |
| 6,930,530 | B1 | * | 8/2005 | Wang | ............... | 327/333 |
| 7,253,999 | B2 | * | 8/2007 | Ker et al. | ............... | 361/56 |
| 7,512,514 | B2 | * | 3/2009 | Duarte et al. | ............... | 702/130 |

* cited by examiner

Primary Examiner—Stephen W Jackson

(57) ABSTRACT

An on-chip latch-up protection circuit. The lath-up protection circuit includes a core circuit, a power switch, and a current extractor. The power switch controls major current flowing through the core circuit. The current extractor detects amplitude of the major current. The power switch, the core circuit and the current extractor are coupled in series between a relatively-high power line and a relatively-low power line. When the major current surpasses a predetermined amplitude, the power switch is turned off, causing latch-up stops.

34 Claims, 8 Drawing Sheets

US 7,663,853 B2

ON-CHIP LATCH-UP PROTECTION CIRCUIT

CROSS-REFERENCE TO RELATED APPLICATIONS

The present application is a continuation of U.S. application Ser. No. 10/446,049 filed May 28, 2003, now U.S. Pat. No. 7,253,999 which in turn claims priority to TW Application No. 91111475 filed May 29, 2002.

BACKGROUND OF THE INVENTION

1. Field of the Invention

The present invention relates in general to an on-chip latch-up protection circuit. In particular, the present invention relates to an on-chip latch-up protection circuit detecting and terminating a latch-up.

2. Description of the Related Art

A complementary metal-oxide-semiconductor (CMOS) circuit in an integrated circuit (IC) of a semiconductor chip is at least formed by a positive-type metal-oxide-semiconductor field-effect-transistor (PMOSFET) and negative-type metal-oxide-semiconductor field-effect-transistor (NMOSFET). As known in the art, a silicon-controlled rectifier (SCR) with a PNPN structure is consequently formed by the combination of a parasitic PNP bipolar-junction transistor (BJT) under the PMOS and a parasitic NPN BJT under the NMOS. When triggered, the SCR allows a large current to flow through due to its low turn-on resistance and low holding voltage. Unless the voltage across or provided to a triggered SCR is smaller than the holding voltage or the current through the SCR is limited to a certain low level, the SCR will be constantly "locked" to consume a lot of powers. Such an event is named as latch-up, which is well-known in the art.

A number of methods have being used for preventing latch-up. Guard rings in a layout, minimum distance requirement between PMOSs and NMOSs, or epitaxy or retrograde well formation in a manufacturing process for reducing spread resistance of wells are examples of methods used for increasing triggering voltages of SCRs and preventing latch-up. A clamping circuit formed by Zener diodes is proposed in U.S. Pat. No. 5,347,185 to expect that the voltage difference between power lines are less then the trigger voltage of an SCR and latch-up can be hopefully avoided. However, transient current and noises occur during normal operations may also cause triggering of SCRs. Once a SCR is triggered, latch-up cannot be stopped until power supply is switched off manually when utilizing the methods described above.

In U.S. Pat. Nos. 5,212,616 and 5,379,174, voltage or current provided to a circuit can automatically he cut off when latch-up is detected. After a predetermined period of time, voltage or current can be supplied to the circuit again. However, voltage across a subjected circuit is used as a detected reference for latch-up protection in both patents.

SUMMARY OF THE INVENTION

An object of the present invention is using current flowing through the subjected circuit as a reference for cutting off power supply provided to a subjected circuit.

Another object of the present invention is resuming the power supply after a period of time when the power supply is cut off.

Accordingly, the present invention provides an on-chip latch-up protection circuit. The lath-up protection circuit comprises a core circuit, a power switch, and a current extractor. The power switch is used for controlling major current flowing through the core circuit. The current extractor is used for detecting amplitude of the major current. The power switch, the core circuit and the current extractor are coupled in series between a relatively-high power line and a relatively-low power line. When the major current surpasses a predetermined amplitude because of latch-up, the power switch is opened and lath-up stops.

The current extractor comprises a current-mirror circuit and a load. The current-mirror circuit comprises a first transistor and a second transistor coupled together at control gates. The primary current flows through the first transistor, and induced current flowing through the second transistor is proportional to the primary current. The load is coupled in series with the second transistor between the relatively high power line and the relatively low power line.

The current extractor can be implemented with a mere resistor.

The advantage of the present invention is the automatic detection and termination of latch-up on a circuit of a chip. The circuit further allows the core circuit to resume normal operations after latch-up is stopped.

DESCRIPTION OF THE DRAWINGS

For a better understanding of the present invention, reference is made to a detailed description to be read in conjunction with the accompanying drawings, in which.

DETAILED DESCRIPTION OF THE INVENTION

The First Embodiment

Figure 1B:
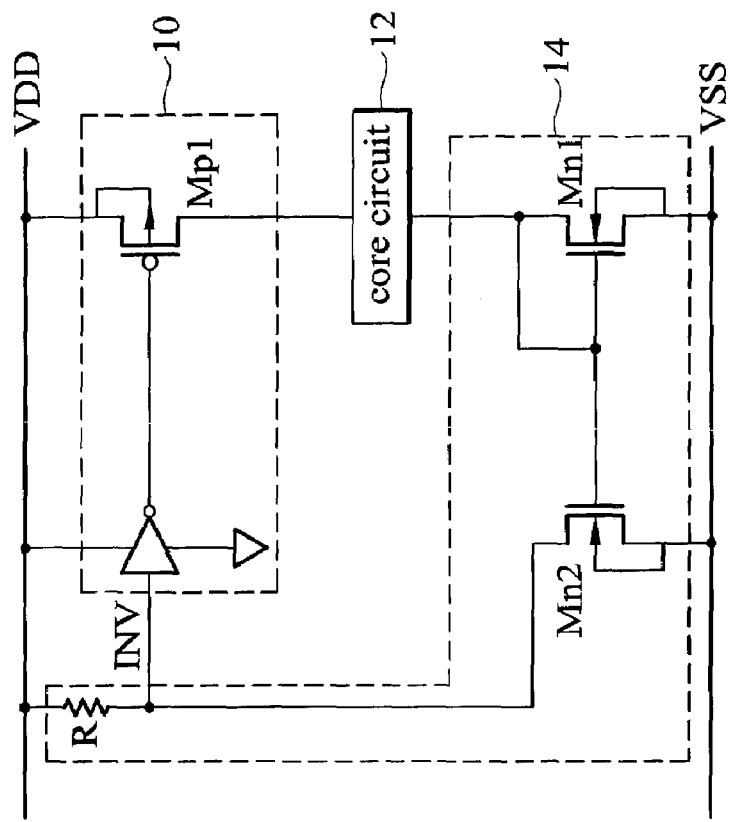
FIG. 1B is a circuit to implement the block diagram in FIG. 1A.
Figure 1A:
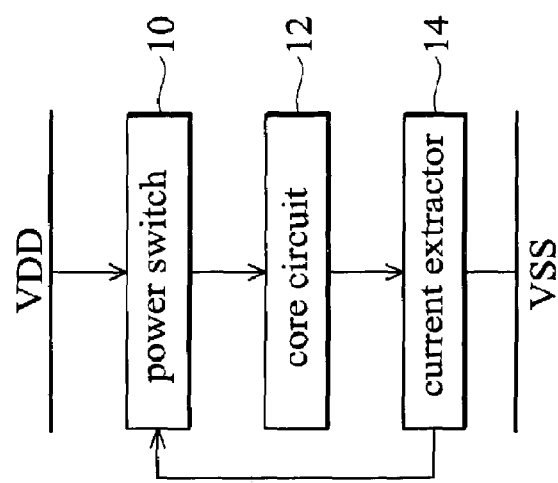
FIG. 1A is a block diagram of the first embodiment of an on-chip latch-up protection circuit according to the present invention.

FIG. 1A is a block diagram of the first embodiment of an on-chip latch-up protection circuit according to the present invention. A power switch 10, a core circuit 12 and a current extractor 14 are sequentially coupled in series between a high power line VDD and a low power line VSS. The core circuit 12 can be CMOS circuits excluding those of input/output (I/O) ports and is generally located at the center of a chip carrying out logic or analogue process. Total current flowing through the core circuit 12 is named major current. A great part of the major current flows through the power switch 10 and the current extractor 14 coupled in series with the core circuit 12.

The current extractor 14 is used to detect amplitude of the major current. When the major current surpasses a predetermined amplitude, the power switch 10 is turned off by the current extractor 14 to become an open circuit. The major current is then blocked or decreased to almost zero. As a result, the major current flowing through the core circuit 12 is too small for latch-up to persist. The predetermined amplitude of the major current varies according to the variety of the core circuit 12 and is used as a reference for distinguishing a latch-up event from normal operations.

When the power switch 10 is turned off to become an open circuit, the current extractor 14 in FIG. 1A detects the sudden change of the major current from large during latch-up to very small. The current extractor 14 then turns on the power switch 10 to allow current flowing through the core circuit 12 for normal operations.

Simply put, when latch-up is detected, power supply is cut off by the ESD protection circuit of the present invention to interrupt and dismiss latch-up. Similar to feedback effect, after an interval of time delay, power supply will be provided to the core circuit 12 again for normal operations.

FIG. 1B is a diagram of circuit to implement the block diagram in FIG. 1A. The current extractor 14 comprises a current-mirror circuit and a resistor R. The current-mirror circuit comprises two NMOSs, Mn1 and Mn2, coupled at gates. The gate of the NMOS Mn1 is also coupled to its drain. The NMOS Mn1 and the core circuit 12 are coupled in series allowing the major current flows through the NMOS Mn1. Current flowing through the NMOS Mn2 is approximately proportional to current passing the NMOS Mn1, and is reflected on a voltage difference across the resistor R or the voltage at the node connecting the NMOS Mn2 and the resistor R.

A power switch 10 comprises a PMOS Mp1 and an inverter INV. The PMOS Mp1 is coupled in series with the core circuit 12.

During normal power operations, current flowing through the NMOS Mn1 is approximately equal to the small current sustaining normal CMOS operations. The mirror current flowing through the NMOS Mn2 is thus small. The voltage across the resistor R is also small resulting in a relatively high voltage at the node between the NMOS Mn2 and the resistor R. The inverter INV provides a relatively low voltage to the gate of the PMOS Mp1, accordingly. The PMOS Mp1 is turned on and current is constantly conducted to the core circuit 12.

Once latch-up occurs at the core circuit 12, current flowing through the NMOS Mn2 becomes large as the current flowing through the NMOS Mn1 increases. The voltage at the node between the NMOS Mn2 and the resistor R becomes relatively low. The voltage output by the inverter INV is thus high turning the PMOS Mp1 off. No current is conducted to the core circuit 12 and the latch-up is stopped.

When the PMOS Mp1 is turned off, current flowing through the NMOS Mn1 drops virtually to zero. After recharging through a RC delay, the voltage at the input end of the inverter INV rises back to a relatively high level. The PMOS Mp1 is triggered conducting current to the core circuit 12 for normal operations.

Figure 1D:
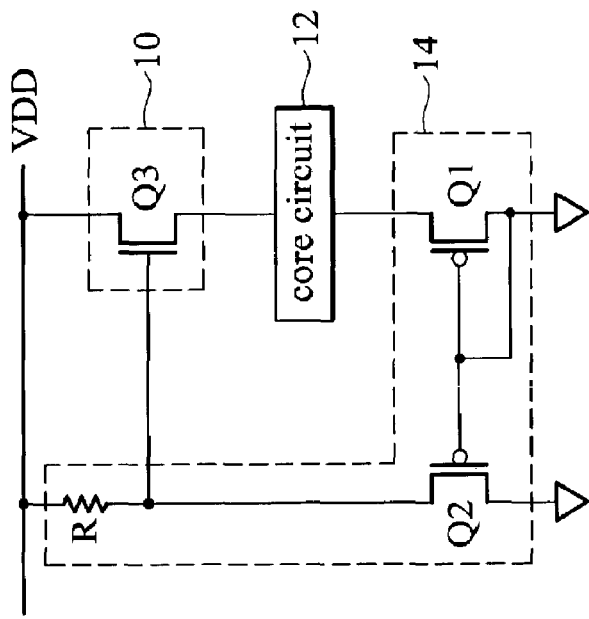
FIG. 1D is another circuit to implement the block diagram in FIG. 1A.
Figure 1C:
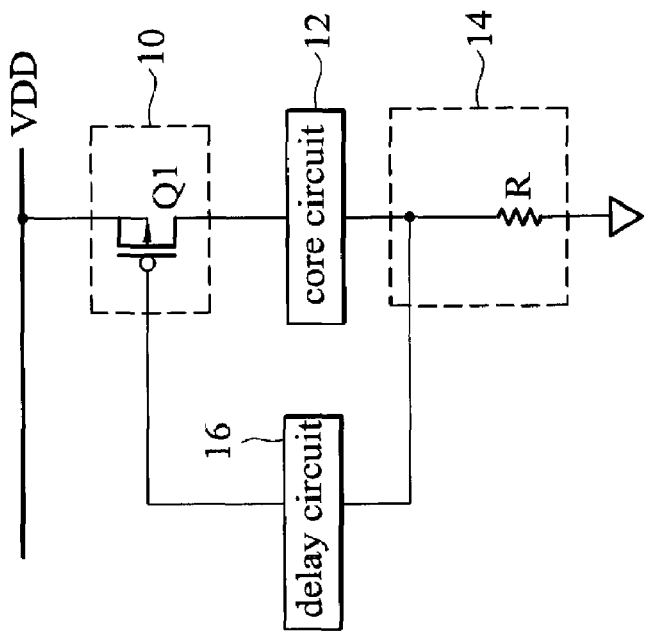
FIG. 1C is another circuit to implement the block diagram in FIG. 1A.

FIG. 1C shows another diagram of circuit to implement the block diagram in FIG. 1A. A current extractor 14 and a power switch 10 are respectively formed by a resistor R and a PMOS Q1. Via an optional delay circuit 16, the switch of PMOS Q1 corresponds to the voltage level at the node between the resistor R and a core circuit 12.

During normal power operations, current flowing through the resistor R is small. The voltage at the node between the resistor R and the core circuit 12 is low and induces the activation of the PMOS Q1. When latch-up occurs at the core circuit 12, current passing through the resistor R increases greatly. The voltage at the node between the resistor R and the core circuit 12 becomes relatively high enough to turn off the PMOS Q1. When the PMOS Q1 is turned off, discharging occurs and the electrical potential at the node between the resistor R and core circuit 12 drops back to a low level. The PMOS Q1 will be turned on again to conduct current flow after a predetermined interval caused by the delay circuit 16.

FIG. 1D is another diagram of a circuit to implement the block diagram in FIG. 1A. A current-mirror circuit comprising two PMOSs Q1 and Q2 is formed in a current extractor 14. A power switch 10 comprises an NMOS Q3. Operation of the circuit in FIG. 1D is similar to the aforementioned circuits and is readily comprehended by those skilled in the art without the addition of further illustrations.

The Second Embodiment

Figure 2B:
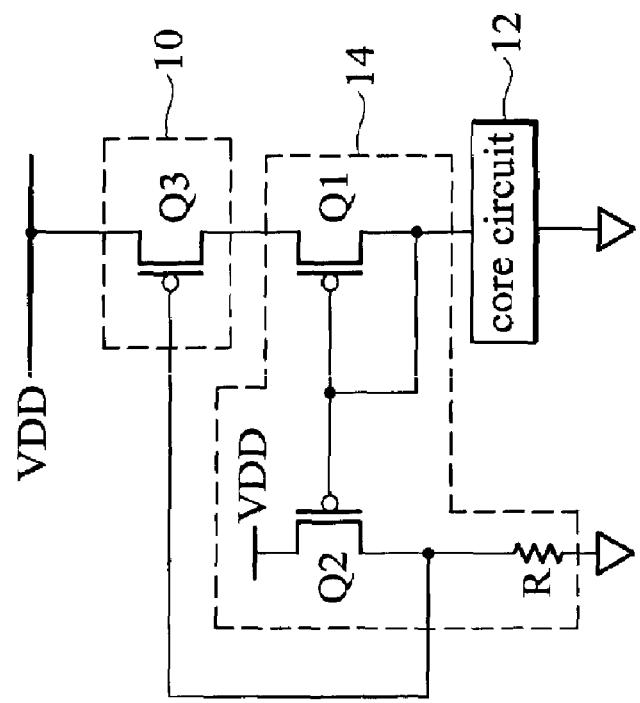
FIG. 2B is a circuit to implement the block diagram in FIG. 2A.
Figure 2A:
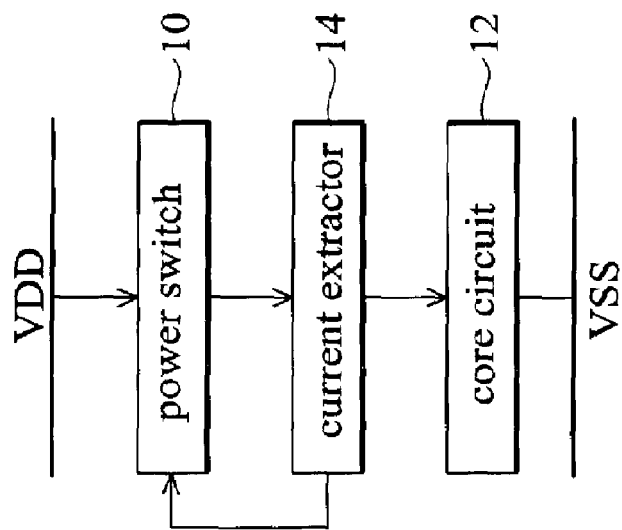
FIG. 2A is a block diagram of the second embodiment according to the present invention.

FIG. 2A is a block diagram of the second embodiment of the present invention. A power switch 10, a current extractor 14 and a core circuit 12 are sequentially coupled in series between a high power line VDD and a low power line VSS. The coupling sequence of the components is variable and has little influence on operational performance under a presumption that the components are coupled in series.

FIG. 2B is a circuit to implement the block diagram in FIG. 2A.

A current extractor 14 comprises a current-mirror circuit and a resistor R. The current mirror circuit comprises two PMOSs, Q1 and Q2, having gates coupling together. The gate of the PMOS Q1 is coupled to its drain. Current flowing through the PMOS Q1 is reflected on a voltage difference across the resistor R or the voltage at the node between the PMOS Q2 and the resistor R.

The power switch 10 comprises a PMOS Q3, coupled in series with the core circuit 12.

During normal power operations, current flowing through the PMOS Q1 is small causing small current flowing through the PMOS Q2 and a small voltage difference across the resistor R. The voltage at the node between the PMOS Q2 and the resistor R becomes relatively low. Therefore, the PMDS Q3 remains activated, conducting current to the core circuit 12.

When latch-up occurs at the core circuit 12, current flowing through the PMOS Q2 grows as current flowing through the PMOS Q1 increases. The voltage at the node between the PMOS Q2 and the resistor R becomes relatively high. Therefore, the PMOS Q3 is switched off, stopping current flow to the core circuit 12, and the latch-up is terminated.

When the PMOS Q3 is turned off, current flowing through the PMOS Q1 drops virtually to zero. After an interval of RC delay, the voltage at the node between the PMOS Q2 and the resistor R becomes relatively low through discharging. The PMOS Q3 is activated again so that current is conducted to the core circuit 12 for normal operations.

Figure 2C:
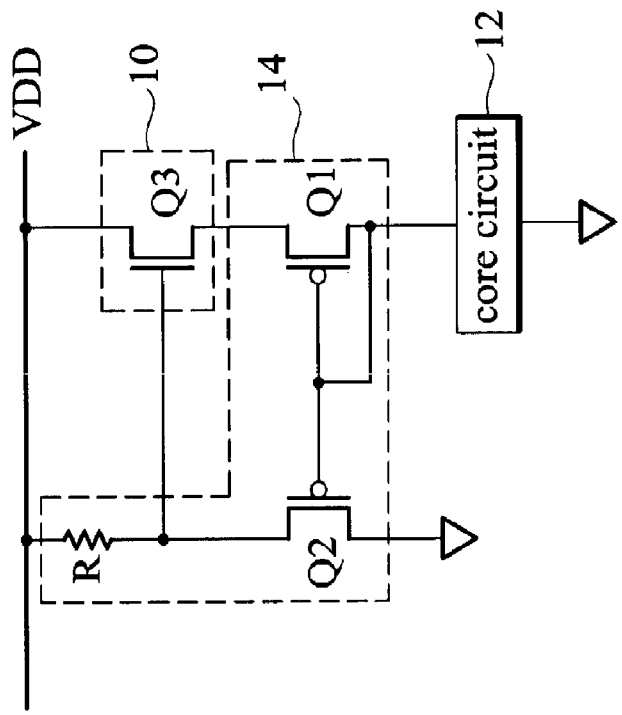
FIG. 2C is another circuit to implement the block diagram in FIG. 2A.

FIG. 2C shows another circuit of the present invention to implement the block diagram in FIG. 2A. A current-mirror circuit comprises two NMOSs, Q1 and Q2, acting as a current extractor 14. A power switch 10 comprises an in inverter and a PMOS Q3.

Figure 2D:
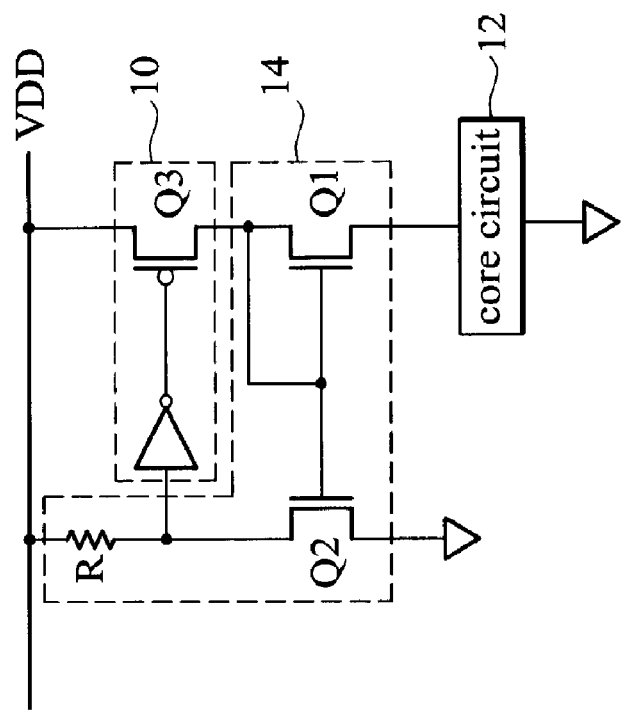
FIG. 2D is another circuit to implement the block diagram in FIG. 2A.

FIG. 2D shows yet another circuit of the present invention to implement the block diagram in FIG. 2A. The current extractor 14 is a current-mirror circuit comprising PMOSs Q1 and Q2. A power switch 10 is a PMOS Q3. Operations of the circuits in FIGS. 2C and 2D are similar to the aforementioned circuits and are easily comprehended by those skilled in the art. No further descriptions are thus required.

The Third Embodiment

Figure 3B:
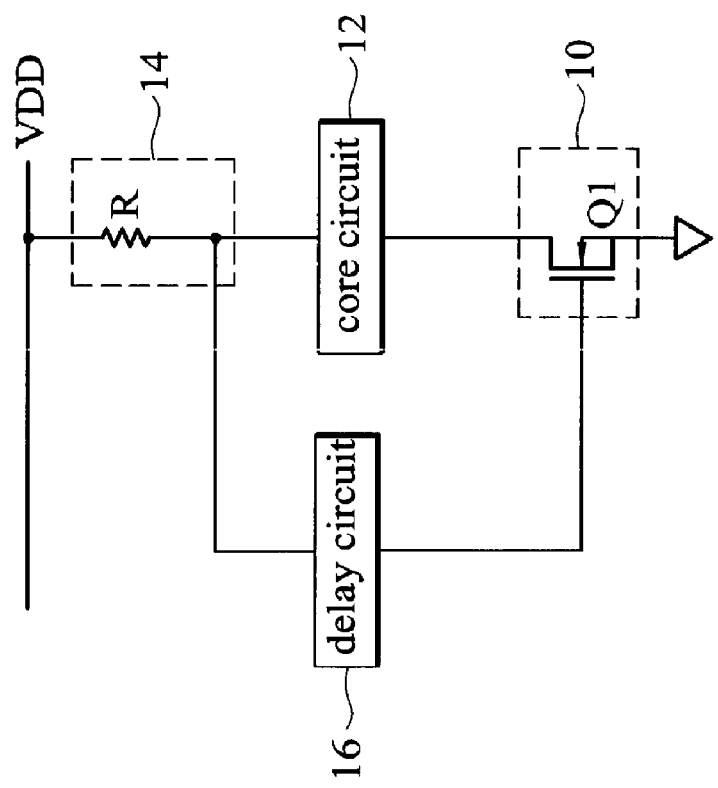
FIG. 3B is a circuit to implement the block diagram in FIG. 3A.
Figure 3A:
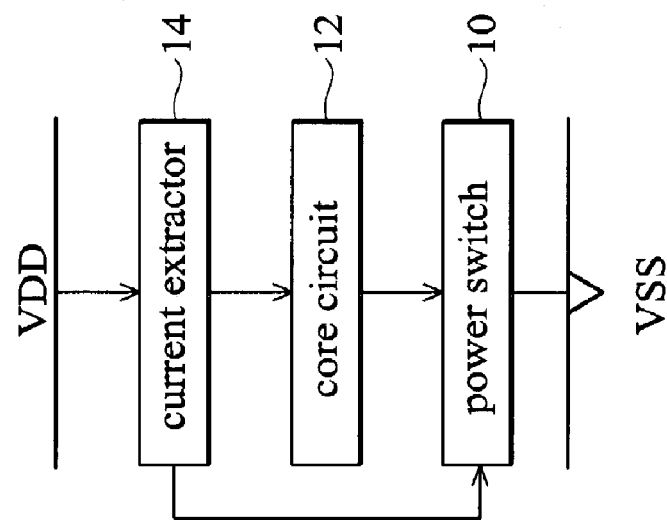
FIG. 3A is a block diagram of the third embodiment of the present invention.

The block diagram of the first embodiment is rearranged in FIG. 3A. A current extractor 14, a core circuit 12 and a power switch 10 are sequentially coupled between a relatively-high power line VDD and a relatively-low power line VSS. It is an embodiment showing that operational performance of the latch-up protection circuit of the present invention is not compromised by changes in the coupling sequence of the components in the circuit.

FIG. 3B shows a circuit to implement the block diagram in FIG. 3A. A current extractor 14 is a resistor R and a power switch 10 is an NMOS Q1. Via an optional delay circuit 16, the control gate of NMOS Q1 is coupled to the node connecting the resistor R and a core circuit 12.

Figure 3C:
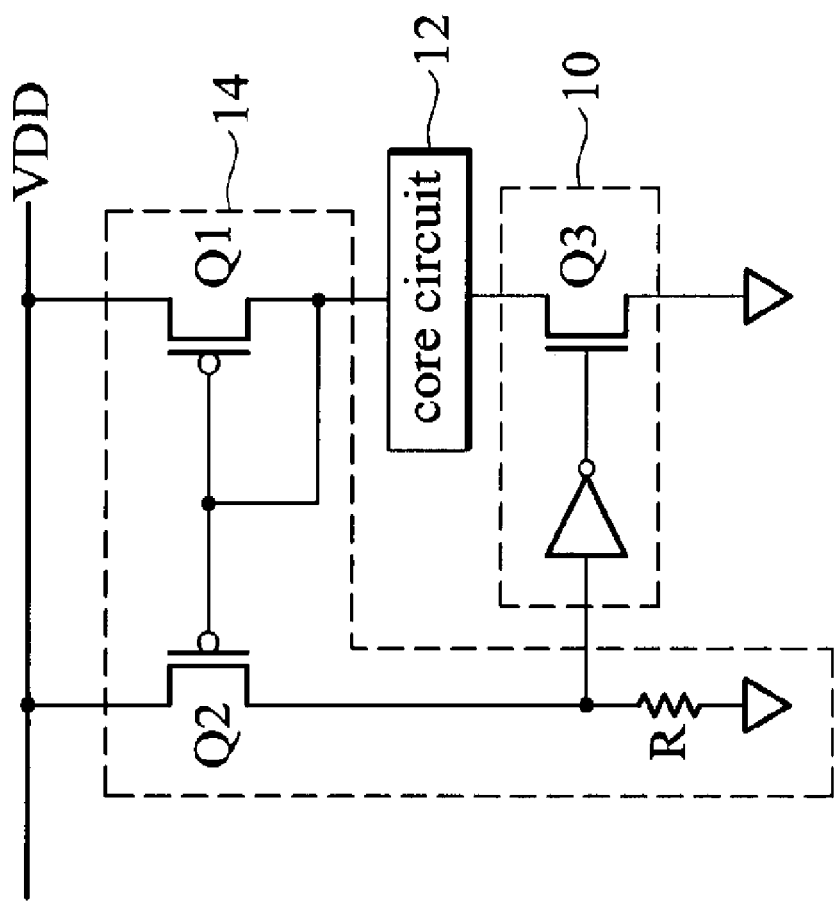
FIG. 3C is another circuit to implement the block diagram in FIG. 3A.

FIG. 3C shows another circuit to implement the block diagram in FIG. 3A. A current-mirror circuit is two PMOSs, Q1 and Q2. A power switch 10 comprises an NMOS Q3 and an inverter. Operations of circuits in FIGS. 3B and 3C are similar to those described in the other embodiments. Related descriptions are thus omitted herein.

The Fourth to the Sixth Embodiments

Figure 4B:
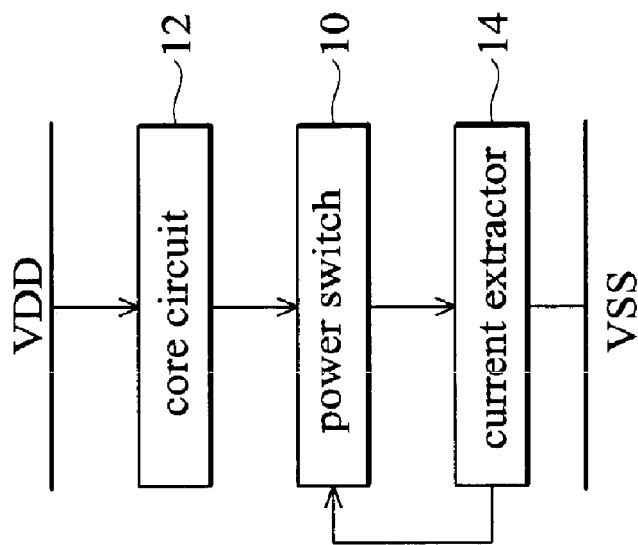
FIGS. 4A to 4C are the fourth to the sixth embodiments of the present invention
Figure 4A:
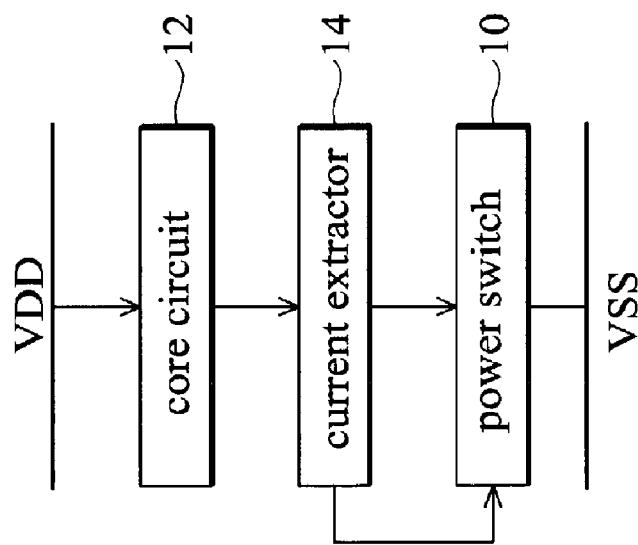
Figure 4C:
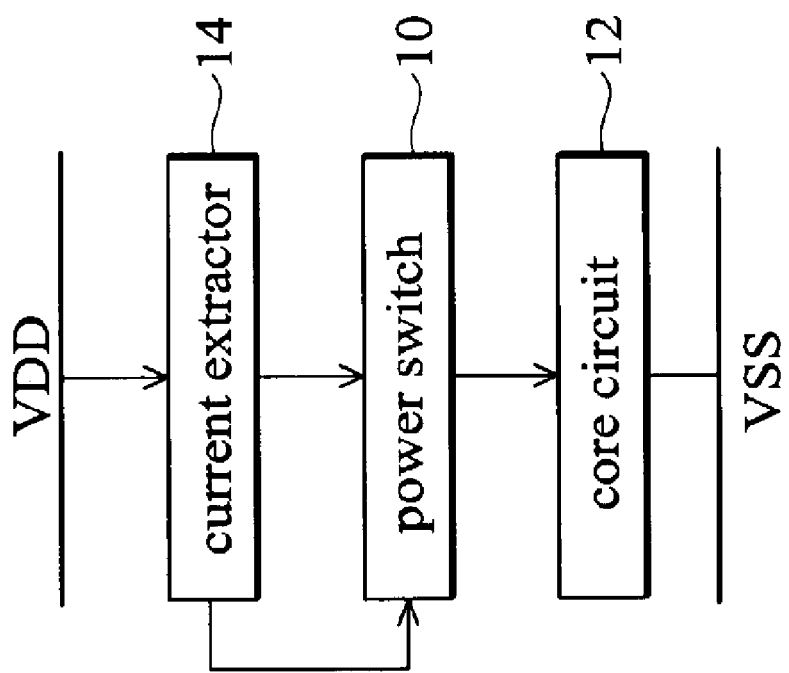

Operational performance is not affected by the sequence the power switch 10, the current extractor 14 and the core circuit 12 coupled between power lines. Three of the six possible combinations of the coupling sequences are described in the aforementioned embodiments. The rest of combinations are illustrated in FIGS. 4A to 4C. Similar to other circuits described in the previous embodiments, operations of the circuits in FIGS. 4A to 4C can easily be deduced by those skilled in the art without further explanation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method, comprising:
monitoring a magnitude of a current flowing through a core circuit using a resistor; and
reducing the current flowing through the core circuit at least temporarily in response to the current flowing through the core circuit surpassing a predetermined magnitude.

2. A method as claimed in claim 1, wherein said monitoring comprises monitoring the current flowing out of the core circuit.

3. A method as claimed in claim 1, wherein said monitoring comprises monitoring the current flowing into the core circuit.

4. A method as claimed in claim 1, wherein said monitoring comprises monitoring the current flowing into a power switch coupled to the core circuit.

5. A method as claimed in claim 1, wherein said monitoring comprises monitoring the current flowing out of a power switch coupled to the core circuit.

6. A method as claimed in claim 1, wherein said monitoring comprises monitoring a major current flowing through the core circuit.

7. A method as claimed in claim 1, wherein said reducing comprises at least partially turning off a power switch coupled to the core circuit.

8. A method as claimed in claim 1, wherein said monitoring comprises mirroring the current flowing through the core circuit.

9. A method as claimed in claim 1, wherein the predetermined magnitude is selected to stop latch-up.

10. A method as claimed in claim 1, further comprising resuming the current flowing through the core circuit after a period of time after said reducing.

11. A method as claimed in claim 1, wherein said reducing comprises reducing the flow of current to no current, or nearly no current.

12. A method as claimed in claim 1, wherein the predetermined magnitude is selected to prevent latch-up.

13. An apparatus, comprising:
an integrated circuit, said integrated circuit comprising:
a core circuit;
a power switch configured to control major current flowing through the core circuit; and
a current extractor configured to monitor a magnitude of the major current, wherein the current extractor comprises a resistor;
wherein in response to the major current surpassing a predetermined magnitude, the apparatus is configured to turn the power switch at least partially off.

14. An apparatus as claimed in claim 13, wherein the power switch, the core circuit or the current extractor, or combinations thereof, are coupled in series between a relatively high power line and a relatively low power line.

15. An apparatus as claimed in claim 13, wherein the current extractor comprises:
a current-mirror circuit comprising a first transistor and a second transistor coupled together at control gates, induced current flowing through the second transistor being proportional to the major current flowing through the first transistor; and
a load coupled in series with the second transistor.

16. An apparatus as claimed in claim 15, wherein the first transistor or the second transistor, or combinations thereof, comprise NMOS type transistors.

17. An apparatus as claimed in claim 15, wherein the first transistor or the second transistor, or combinations thereof, comprise PMOS type transistors.

18. An apparatus as claimed in claim 13, wherein the power switch comprises a metal-oxide-semiconductor field-effect-transistor (MOSFET) type transistor having a gate controlled by the current extractor.

19. An apparatus as claimed in claim 18, wherein the MOSFET type transistor comprises an NMOS type transistor.

20. An apparatus as claimed in claim 18, wherein the MOSFET type transistor comprises a PMOS type transistor.

21. An apparatus as claimed in claim 18, wherein an inverter is disposed between the gate of the MOSFET and the current extractor.

22. An apparatus as claimed in claim 13, wherein a delay circuit is implemented between the power switch and the current extractor, the delay circuit being configured to delay an action of the power switch responsive to the current extractor.

23. An apparatus, comprising:
means for monitoring a magnitude of a current flowing through a core circuit using a resistor; and means for reducing the current flowing through the core circuit at least temporarily in response to the current flowing through the core circuit surpassing a predetermined magnitude.

24. An apparatus as claimed in claim 23, wherein said monitoring means comprises means for monitoring the current flowing out of the core circuit.

25. An apparatus as claimed in claim 23, wherein said monitoring means comprises means for monitoring the current flowing into the core circuit.

26. An apparatus as claimed in claim 23, wherein said monitoring means comprises means for monitoring the current flowing into means for switching the core circuit on or off.

27. An apparatus as claimed in claim 23, wherein said monitoring means comprises means for monitoring the current flowing out of means for switching the core circuit on or off.

28. An apparatus as claimed in claim 23, wherein said monitoring means comprises means for monitoring a major current flowing through the core circuit.

29. An apparatus as claimed in claim 23, wherein said reducing means comprises means for at least partially turning off means for switching the core circuit on or off.

30. An apparatus as claimed in claim 23, wherein said monitoring means comprises means for mirroring the current flowing through the core circuit.

31. An apparatus as claimed in claim 23, wherein the predetermined magnitude is selected to stop latch-up.

32. An apparatus as claimed in claim 23, further comprising means for resuming the current flowing through the core circuit after a period of time after said reducing means reduces the current flowing through the core circuit.

33. An apparatus as claimed in claim 23, wherein said reducing means comprises means for reducing the flow of current to no current, or nearly no current.

34. An apparatus as claimed in claim 23, wherein the predetermined magnitude is selected to prevent latch-up.

\* \* \* \* \*